United States Patent [19]

Nemoto et al.

[11] Patent Number: 4,897,133

[45] Date of Patent: Jan. 30, 1990

[54] METHOD FOR MANUFACTURING AN EMBOSSED PATTERN IN A PORTABLE MEDIUM

[75] Inventors: Yoshiaki Nemoto, Yokohama; Hiroshi Ohba, Tokyo, both of Japan

[73] Assignee: Kabushiki Kaisha Toshiba, Kawasaki, Japan

[21] Appl. No.: 146,073

[22] Filed: Jan. 20, 1988

[30] Foreign Application Priority Data

Jan. 20, 1987 [JP] Japan ................................. 62-11043
Jan. 20, 1987 [JP] Japan ................................. 62-11044
Jan. 20, 1987 [JP] Japan ................................. 62-11046

[51] Int. Cl.$^4$ ........................ B32B 31/18; B32B 31/28
[52] U.S. Cl. ...................................... 156/64; 156/219; 156/220; 156/267; 156/268; 156/510; 156/523; 430/256
[58] Field of Search ............... 156/219, 220, 267, 268, 156/510, 523, 64; 430/256

[56] References Cited

U.S. PATENT DOCUMENTS 3,897,964 8/1975 Oka et al. .
3,930,924 1/1976 Oka et al. ............................. 156/268

FOREIGN PATENT DOCUMENTS 0088941 3/1983 European Pat. Off. .

Primary Examiner—Robert A. Dawson
Attorney, Agent, or Firm—Cushman, Darby & Cushman

[57] ABSTRACT

A method for manufacturing an embossed pattern in a base material comprises the steps of forming an embossed portion in the base material; cutting the embossed portion by using a cutter and a controller for three-dimensionally controlling the relative position between the cutter and the base material; and forming a predetermined embossed pattern in the base material. A method for manufacturing embossed patterns comprises the steps of holding processing data per each of the embossed patterns; and processing the embossed patterns by continuously connecting the processing data to each other sequentially. A method for manufacturing embossed patterns comprises the steps of dividing processing data of the patterns into left and right sections with respect to each of the patterns to process the patterns left and right; providing the same number of upper and lower processing lines with respect to the patterns; and continuously processing portions between the patterns.

An apparatus for forming an embossed pattern in a portable medium in which an embossed portion having an area larger than that of the embossed pattern is formed in a position for forming the embossed pattern on a surface of the medium. The apparatus comprises a cutter for cutting the embossed portion on the medium along the surface of the medium, and a device for memorizing embossed pattern information to be formed and controlling a relative position of the cutter with respect to the medium in accordance with the embossed pattern information.

10 Claims, 27 Drawing Sheets

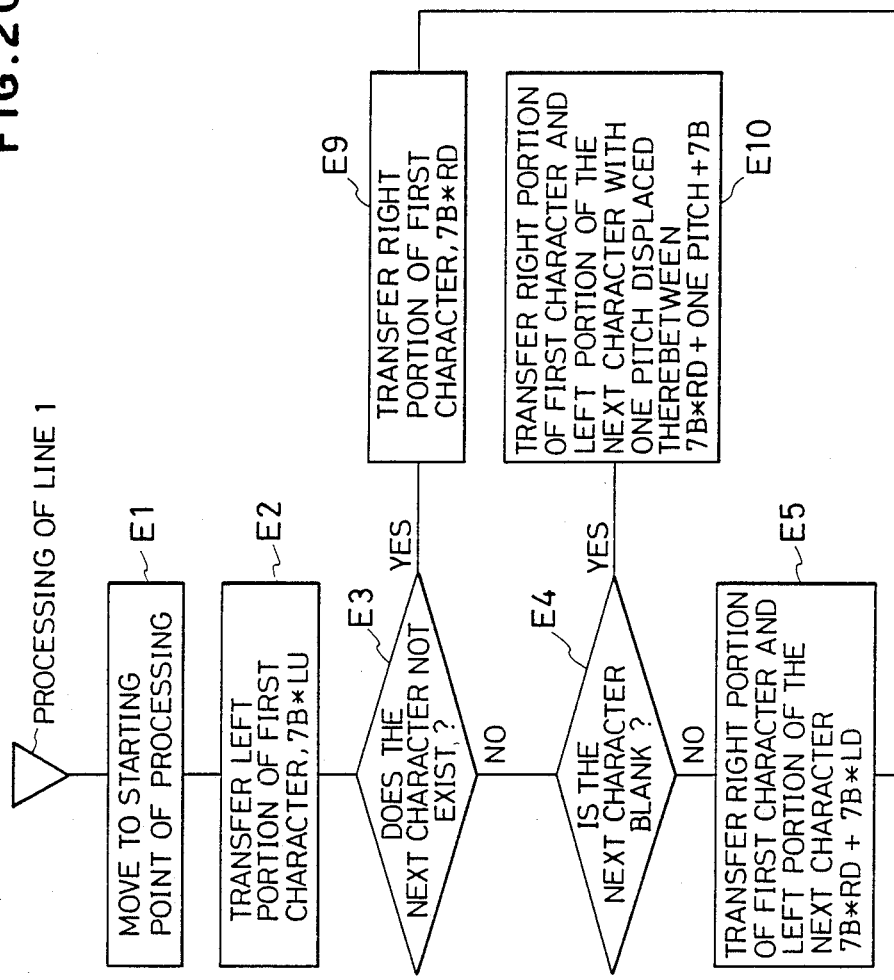

METHOD FOR MANUFACTURING AN EMBOSSED PATTERN IN A PORTABLE MEDIUM

The present invention relates to a method and an apparatus for manufacturing an embossed pattern such as a character in a portable medium in the shape of a card such as an IC card.

BACKGROUND OF THE INVENTION

In a portable medium such as an IC card, as shown in FIGS. 1 and 2, a semiconductor chip constituting an unillustrated microcomputer and a memory is embedded in a pocket sized card base material 1 made of plastic, etc. A plurality of external terminals are disposed on a surface of the card base material to transmit and receive data between the card and an external apparatus such as a reader, writer, etc., and to input a power source to the card, for example.

In accordance with the rules of the International Standard Organization, the thickness of the card base material 1 must be 0.76 mm, and have predetermined longitudinal and transversal lengths.

Further, the IC card is constructed to be used together with a known magnetic card including a magnetic stripe 3 and embossed characters 4 on the surfaces of the card base material 1.

FIG. 3 shows a conventional method for manufacturing embossed characters, etc., in the card base material 1 of such an IC card.

In FIG. 3, a female die 6 is arranged on the front surface side of the card base material 1, and the card base material 1 is pressed by a male die 5 upwards from the back face side of the card, thereby manufacturing required embossed characters 4 on the surface of the card base material 1.

As shown in FIG. 4, a new IC card has recently been considered in which a keyboard 7 and a liquid crystal display section 8 are disposed on the back face of the card base material 1 and the content of a memory is confirmed by operating a microcomputer disposed in the card by manual operation without using a reader, a writer, etc.

However, in such IC card in which the keyboard 7, etc. are disposed on the back face, when the male die 5 is pressed on the back face side of the card, the keyboard 7 may be damaged. Thus, the embossed characters cannot be formed on the surface of the card by pressing the card base material 1 upwards from the back face side by the male die 5 when such instruments as keyboards and LCDs are included.

SUMMARY OF THE INVENTION

To overcome the problems mentioned above, an object of the present invention is to provide a method and an apparatus for manufacturing an embossed pattern in a portable medium which can suitably form an embossed pattern, etc., on a surface of a card base material without applying a mechanical impact force to the card base material.

With the above object in view, a method and an apparatus of the present invention for manufacturing an embossed pattern in a portable medium, an embossed portion is formed in the portable medium and is cut by using a cutter for cutting the embossed portion and a controller for three-dimensionally controlling the relative position between the cutter and the portable medium; a predetermined embossed pattern is thus formed in the portable medium without mechanical impact force on the card.

In the manufacturing method mentioned above, the relative position between the cutter and the portable medium in which the embossed portion is formed in advance is three-dimensionally controlled by the controller, thereby cutting the embossed portion with the cutter to form the predetermined embossed pattern in the portable medium. Accordingly, the embossed pattern is formed on the back surface of the portable medium with almost no mechanical impact force applied to the portable medium.

In the present invention, the embossed pattern indicates a pattern such as a character, etc., formed by a projection of a hardened adhesive as mentioned above, and is similar to an embossed pattern formed by using die with respect to appearance and mechanical strength. The embossed pattern includes characters, numerals, marks, etc., formed by the projection of the hardened adhesive.

A commonly embossed pattern in the portable medium is preferably formed in a step for forming the embossed portion.

The embossed portion is preferably continuously formed in at least a region in which the embossed pattern of the portable medium is continuously formed.

BRIEF DESCRIPTION OF THE DRAWINGS

The present invention will be more apparent from the preferred embodiments thereof in conjunction with the accompanying drawings in which:

FIGS. 20(a), 20(b) and 21 are views showing detailed flow charts of the processing of manufacturing LINE 1 and an outline processing thereof, respectively;

DETAILED DESCRIPTION OF THE PREFERRED EMBODIMENTS

The preferred embodiments of the present invention will now be described with reference to the accompanying drawings.

Figure 5:
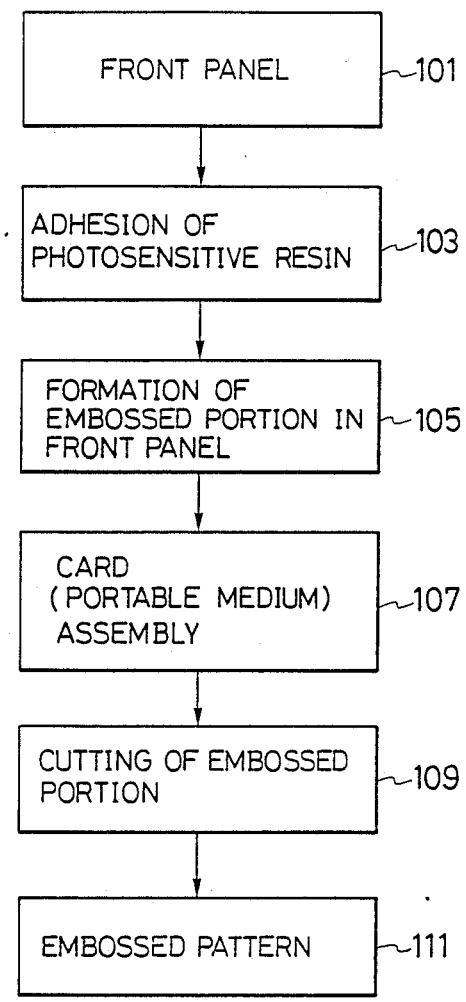
FIG. 5 is a view for showing the steps of a method for manufacturing an embossed pattern in a portable medium in accordance with one embodiment of the present invention.

FIG. 5 is a view showing the steps of a method for manufacturing an embossed pattern in a portable medium in accordance with one embodiment of the present invention. First, a front panel constituting a portable medium such as an IC card is formed in step 101. Thereafter, a photosensitive resin is adhered to the front panel in step 103, and an embossed portion is formed in step 105. Next, after a module for an IC card, a sheet, etc., are laminated on the front panel in step 107, the embossed portion is cut in step 109, thereby forming the embossed pattern in step 111.

FIGS. 6A to 6I show examples of steps 101 to 105 mentioned above.

Figure 6A:
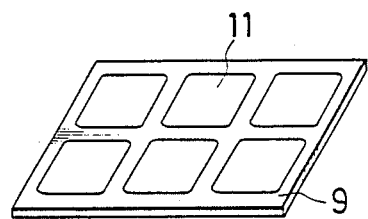
FIGS. 6A to 6I are view for explaining the steps for forming an embossed portion in the portable medium.
Figure 6B:
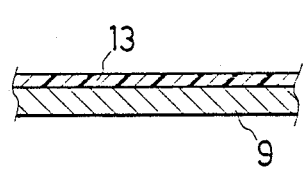

As shown in FIG. 6A, a predetermined design print 11 is performed on a front panel base plate 9 made of stainless steel, for example. As shown in FIG. 6B, a photopolymer 13 having a predetermined thickness is adhered onto the design print 11 by an adhesive which is not shown. The photopolymer 13 may be the one used in general as a water soluble photosensitive resin.

Figure 6C:
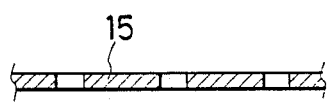

Next, as shown in FIG. 6C, a negative film 15, having an approximately transparent portion left as an embossed portion, and the remaining opaque portion are disposed on the front panel base plate 9, closely contracting it. The approximately transparent portion of the negative film 15 forms outer frame portions divided per the respective embossed patterns formed on the card base material 1.

The negative film 15 has an approximately transparent portion in a predetermined position for leaving characters such as CV commonly formed on a plurality of card base materials 1 as an embossed portion.

Figure 6D:
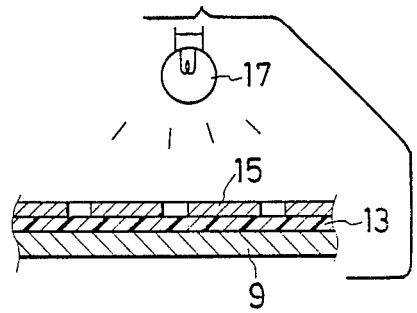

Thereafter, as shown in FIG. 6D, the photopolymer 13 is sufficiently irradiated by an ultraviolet lamp 17, for example, through the approximately transparent portion, from above the negative film 15. Accordingly, the photopolymer 13 on the front panel base plate 9 is photosensitized in the shape of an outer frame of the respective embossed patterns and is hardened.

Figure 6E:
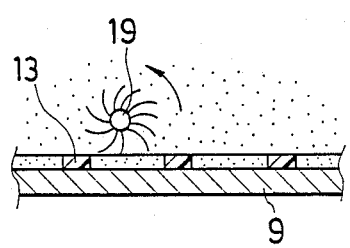

Then, after the photopolymer 13 has sufficiently been photosensitized by the ultraviolet lamp 17, a photopolymer 13 which is not photosensitized is cleaned away by water cleaning using a brush 19 as shown in FIG. 6E. Thus, the embossed pattern 21 in the shape of the outer frame of the embossed pattern is formed on the front panel base plate 9.

Figure 6F:
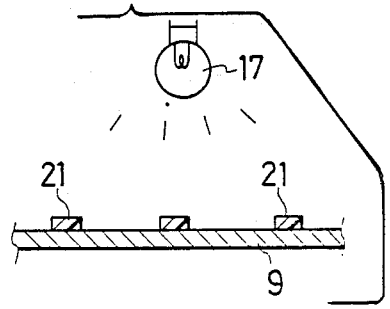

Thereafter, the embossed portion 21 is further irradiated by the ultraviolet lamp 17 to particularly expedite the hardening of a side surface of the embossed portion 21 as shown in FIG. 6F.

Figure 6G:
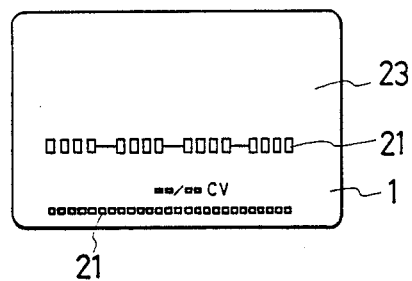

Next, the front panel base plate 9 in which the embossed portion 21 is formed is cut by pressing to form a front panel 23 in the shape of a card as shown in FIG. 6G. Thereafter, the front panel 23 and an unillustrated IC card body having a module for the IC card therein are laminated with each other to form an IC card base material 1 as in step 107 of FIG. 5.

Figure 6H:
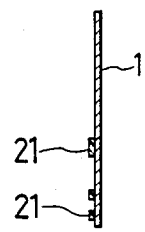
Figure 6I:
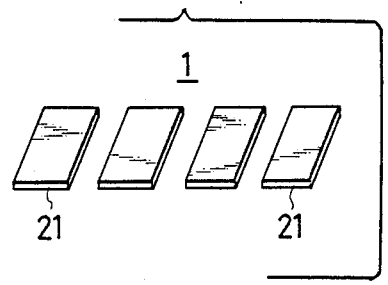

FIG. 6H is a sectional view of FIG. 6G, and FIG. 6I is a perspective view of the embossed portion 21.

Since the photopolymer 13 is approximately transparent after it has been photosensitized, designs of banks, credit companies, etc., printed on the front panel base plate 9 are not damaged.

The embossed portion 21 formed in the card base material 1 is cut in step 109 as mentioned above. The embossed portion 21 is cut by a cutter and a cut position controller as shown in FIGS. 7 and 8.

The card base material 1 is fixed onto a table 25 with the embossed portion 21 as an upper surface. The table 25 is movable by an unillustrated motor in X axis direction of FIG. 7 with respect to the apparatus body 27, and is supported by a movable base 29 thereon movable in Y axis direction. Thus, the table 25 is movable in the directions of X and y axes of FIG. 7.

Figure 7:
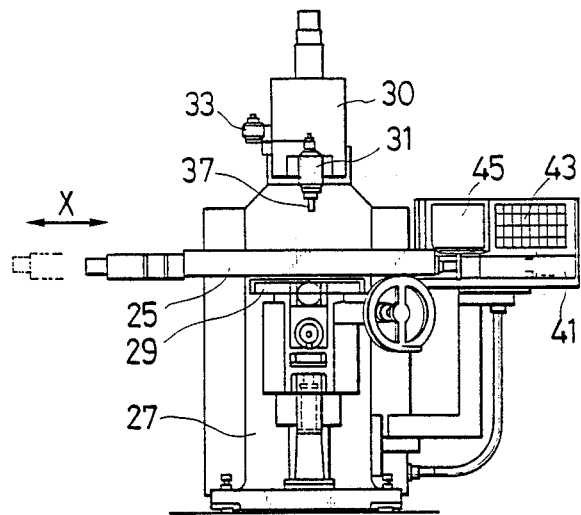
FIGS. 7 and 8 are views showing a cutter and a cut position controller.
Figure 8:
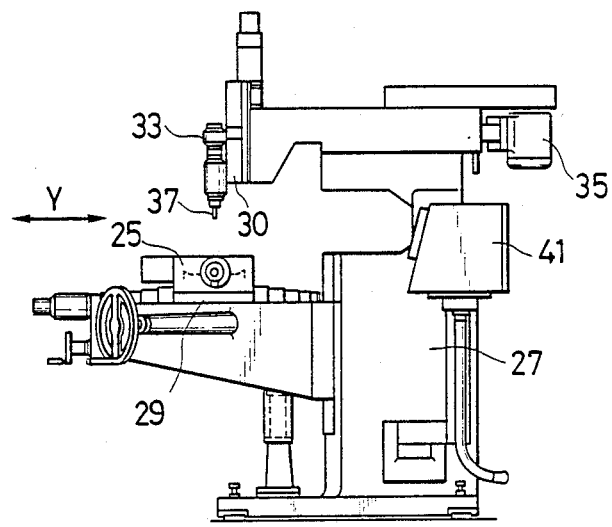

A movable base 30 is movably supported by the apparatus body 27 in Z axis direction of FIG. 7, and a spindle 31 is rotatably supported by the movable base 30. A drive force of a motor 35 is transmitted to the spindle 31 through a rotary interconnecting device 33.

Figure 9:
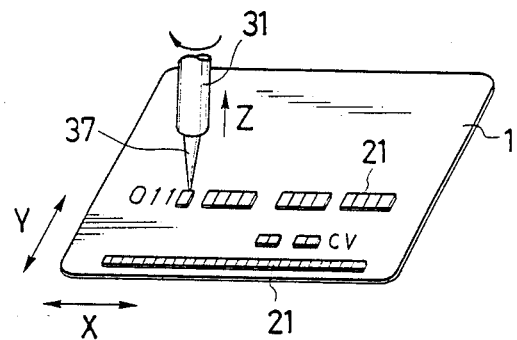
FIG. 9 is a view showing a state in which the embossed portion is cut.

As shown in FIG. 9, a drill or cutter 37 is fixed to an end of the spindle 31 to cut the embossed portion 21 in the card base material 1.

The embossed portion 21 is arbitrarily cut to make a predetermined embossed pattern by controlling the movement of the directions X and Y axes of the table 25 and Z axis of the drill 37.

Figure 10:
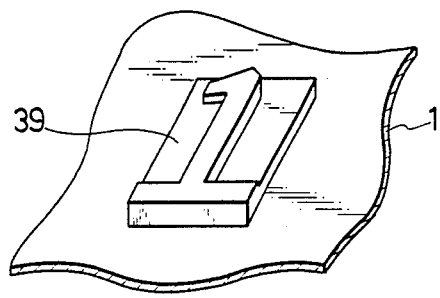
FIGS. 10 and 11 are views showing the embossed pattern.

In FIG. 10, numeral "1" is formed, and the embossed portion 21 forms an outer frame portion of the respective embossed patterns so that a portion of the embossed pattern along the outer frame portion, which is a lower edge portion of numeral "1", may not be cut. Accordingly, the operating steps are simplified, and the cutting time is reduced.

The embossed portion 21 is cut with a base portion 39 left as an adhering base portion of the embossed portion 21 adhered to the card base material 1 so that the adhering strength is increased in comparison with only a linear adhering of the embossed pattern. In this manner, the embossed portion can be prevented from peeling off of the base material 1.

Figure 11:
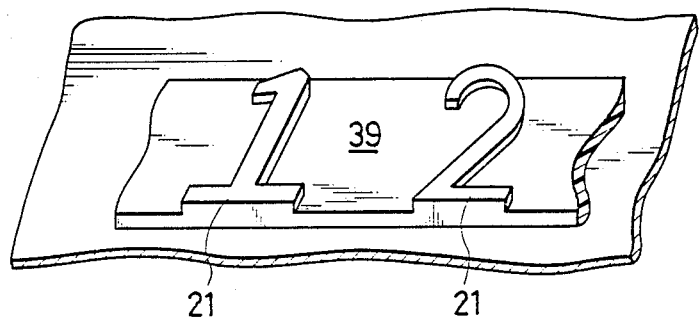

As shown in FIG. 11, when the embossed portion 21, comprising a plurality of linearly arranged symbols, is cut with a base portion 39 left, the adhering stength is further increased by the base portion 39 between the embossed patterns.

Figure 12:
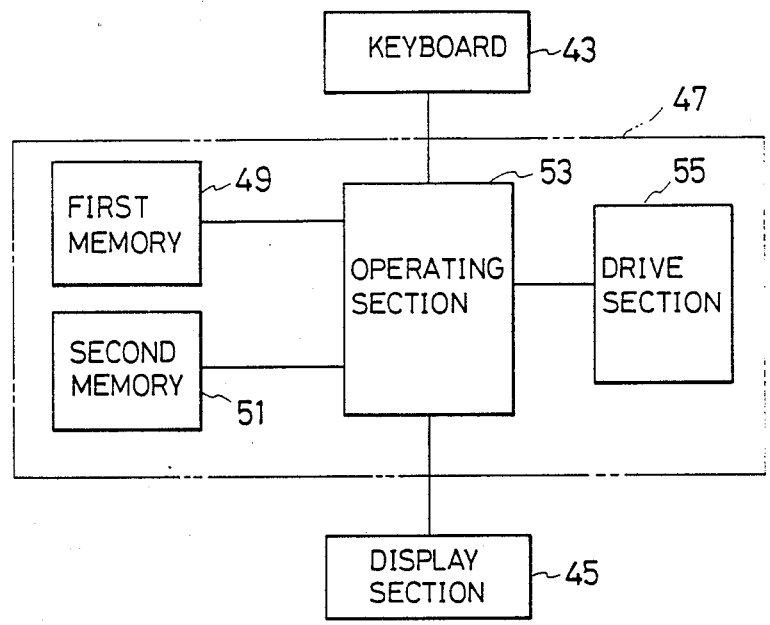
FIG. 12 is a controlling block view of the cutter and the cut position controller.

The cutting operation of the embossed portion 21 in the card base material 1 is controlled by an input controller 41 provided within the apparatus body 27. As shown in FIG. 12, the input controller 41 comprises a keyboard section 43 for inputting data, a display section 45 for displaying data, and a control section 47.

The control section 47 has a first memory 49 for memorizing the position of the embossed pattern, a second memory 51 for memorizing data inputted by the keyboard section 43, an operating section 53, such as a CPU, for performing calculations with respect to data in the first and second memories 49 and 51. The central section also includes a drive section 55. The drive section 55 controls the positions of the spindle 31 and the embossed portion 21 of the card base material 1 fixed onto the table 25, and controls the rotation of the spindle 31.

The first memory 49 memorizes the position of the embossed pattern to be formed in advance, e.g., the positions of three dimensional lines, the sizes and character styles of the respective embossed patterns, etc.

The second memory 51 inputs and memorizes a series of characters such as #LINE 1 #40000 #LINE 2 #0187—by the operation of the keyboard section 43.

Figure 1:
FIG. 1 is a perspective view showing a front face portion of a conventional portable medium.
Figure 2:
FIG. 2 is a side view of the conventional portable medium.
Figure 3:
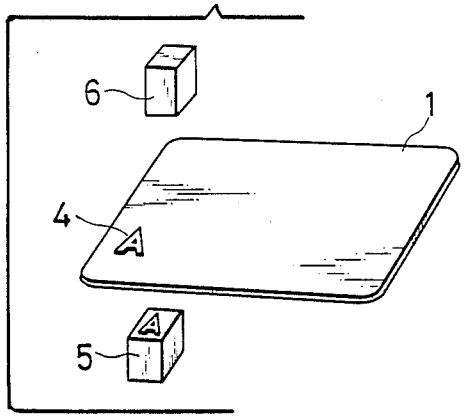
FIG. 3 is a perspective view for explaining a conventional method for manufacturing an embossed pattern in the portable medium.
Figure 4:
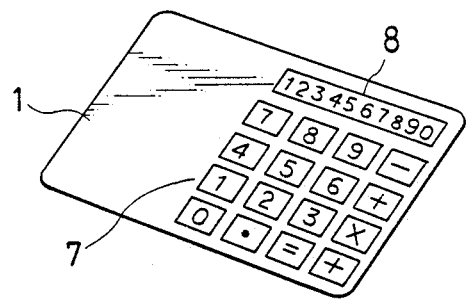
FIG. 4 is a perspective view showing a back face portion of another conventional portable medium.

The embossed pattern formed as above has physical characteristics substantially equal to those of a plastic material made of vinyl chloride, etc. The embossed pattern of the present method is substantially equal to the embossed pattern formed by the molding of die as shown in FIG. 1 with respect to appearance and mechanical strength.

Even an IC card having a structure in which a keyboard, etc., are arranged on the back face side may be found by the present process since substantially no mechanical and thermal shock are applied to the card base material 1 during the embossing process. The embossed pattern will have approximately the same height on the surface thereof as prior known IC cards.

The embossed pattern 21 of the card base material 1 is formed on the front panel 23 before the assembly of the card base material 1 so that, when the photopolymer 13 which is not photosensitized is cleaned by water, the semiconductor element will not be damaged by the water flowing into the IC module.

Characters such as CV commonly formed in the card base material 1 are formed in a step for forming the embossed portion 21 so that the operating steps are simplified and the cutting time is reduced.

Figure 13:
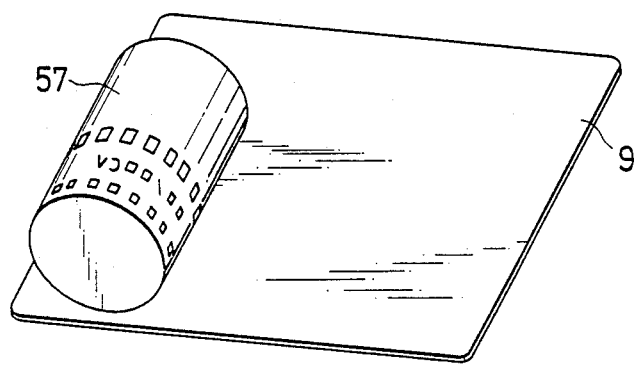
FIG. 13 is a view showing another embodiment of the present invention for forming the embossed portion.
Figure 14A:
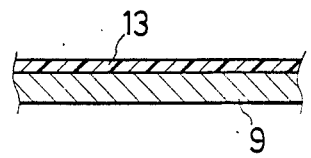
FIGS. 14A to 14E are views for explaining the steps for forming the embossed portion in the portable medium and corresponding to FIGS. 6B to 6F in another embodiment of the present invention.
Figure 14B:
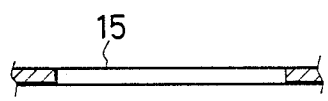
Figure 14C:
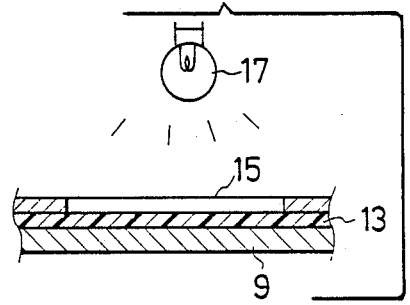
Figure 14D:
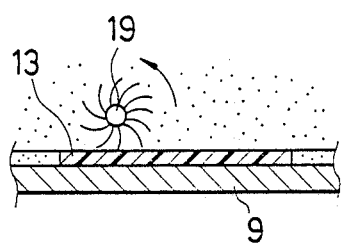
Figure 14E:
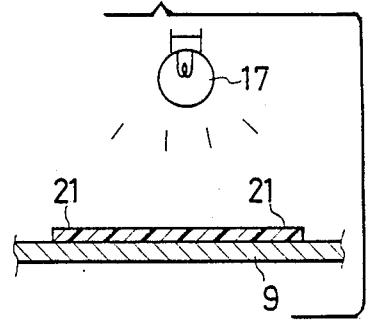
Figure 14F:
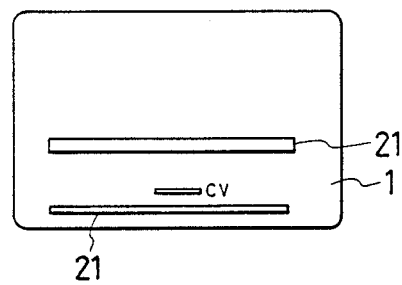
FIGS. 14F to 14G are views showing the embossed portion manufactured in the another embodiment of the present invention and corresponding to FIGS. 6G and 6I.
Figure 14G:
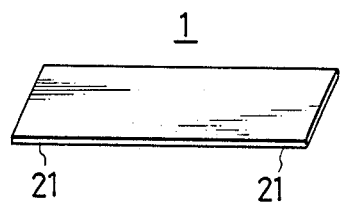

The present invention is not limited to the embodiments mentioned above, but the effects similar to the ones in the above embodiments can be obtained even when the embossed portion 21 is formed by mold-printing a resin, melted by heat, to the front panel base plate 9 by a molding roller 57, as shown in FIG. 13.

An other material, such as a chemical solvent resin may be used as a photosensitive resin, and a continuous sheet may be cut to form the front panel 23 instead of cutting the front panel base plate 9 to form a card.

Further, similar effects can be obtained, even when the embossed portion 21 is formed, by injecting and hardening an adhesive hardened by ultraviolet ray by an adhesive injector.

As mentioned above, in accordance with the present invention, an embossed portion is formed in a portable medium, and the embossed portion is cut using a cutter for cutting the embossed portion, and a cut position controller for three-dimensionally controlling the relative position between the cutter and the portable medium to form a predetermined embossed pattern in the portable medium. Accordingly, even in a portable medium such as a card having a structure in which the medium cannot be pressed by a male die from the back face side, an embossed pattern is suitably formed without applying substantial mechanical shock to the medium.

Further, since the embossed portion is cut while leaving an adhering base portion thereof adhered to the portable medium, the adhering strength of the embossed pattern is high.

Further, the embossed portion is formed in the portable medium, in a state of a front panel, before the assembly of the portable medium. In this manner, the portable medium can be protected from invasion of water and applied pressure during formation of the embossed portion. This prevents the embossed portion from peeling.

When an embossed pattern commonly formed in the portable medium is formed in a step for forming the embossed portion, the operating step for cutting the commonly embossed pattern can be simplified and the cutting time can be reduced.

FIGS. 14A to 14G, and FIG. 15 show another embodiment of a method for manufacturing an embossed pattern in a portable medium in the present invention.

Figure 15:
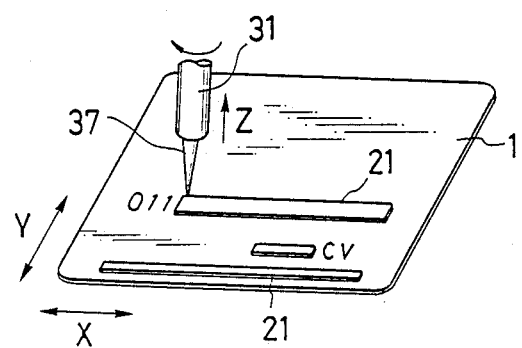
FIG. 15 is a view corresponding to FIG. 9 in which the embossed portion is cut in the another embodiment.

FIGS. 14A to 14F correspond to FIGS. 6B to 6G, and FIG. 14G corresponds to FIG. 6I, and FIG. 15 corresponds to FIG. 9. In FIGS. 14A to 14G and 15, the same or corresponding portions as the ones of FIGS. 6B to 6G, 6I and 9 are designated by the same reference numerals.

In the embodiment shown in FIGS. 14A to 14G and 15, a portion left as an embossed portion in a negative film 15 is different from the one in the first embodiment. The embossed portion is continuously formed in a portion of the thickness of the embossed portion, leaving an adhered base portion adhered to the portable medium.

Namely, in this embodiment, as shown in FIG. 11, when numerals "1" and "2" are formed, the embossed portion 21 is continuously cut so that it is not necessary to cut a portion of the embossed pattern along the outer frame such as an upper edge portion of numeral "2", for example. Further, the embossed portion is cut while leaving a base 39 between the embossed patterns as an adhering base portion of the embossed portion 21 adhered to the card base material 1 so that the adhering strength can be increased in comparison with linear adhering of the embossed pattern.

In this embodiment, the other steps in a method for manufacturing the embossed pattern in the portable medium are similar to the ones in the first embodiment.

In accordance with the manufacturing method in this embodiment, the embossed portion is continuously formed in a region of the embossed portion so that the embossed portion is cut while leaving the adhering base portion adhered to the portable medium, thereby increasing the adhering strength of the embossed pattern and restricting the peeling thereof.

As shown in FIGS. 9 and 15, when the embossed pattern is processed by the drill or cutter 37, the cutting operation is controlled by the input controller 41 having the control section 47 of FIG. 12 as follows.

Figure 16:
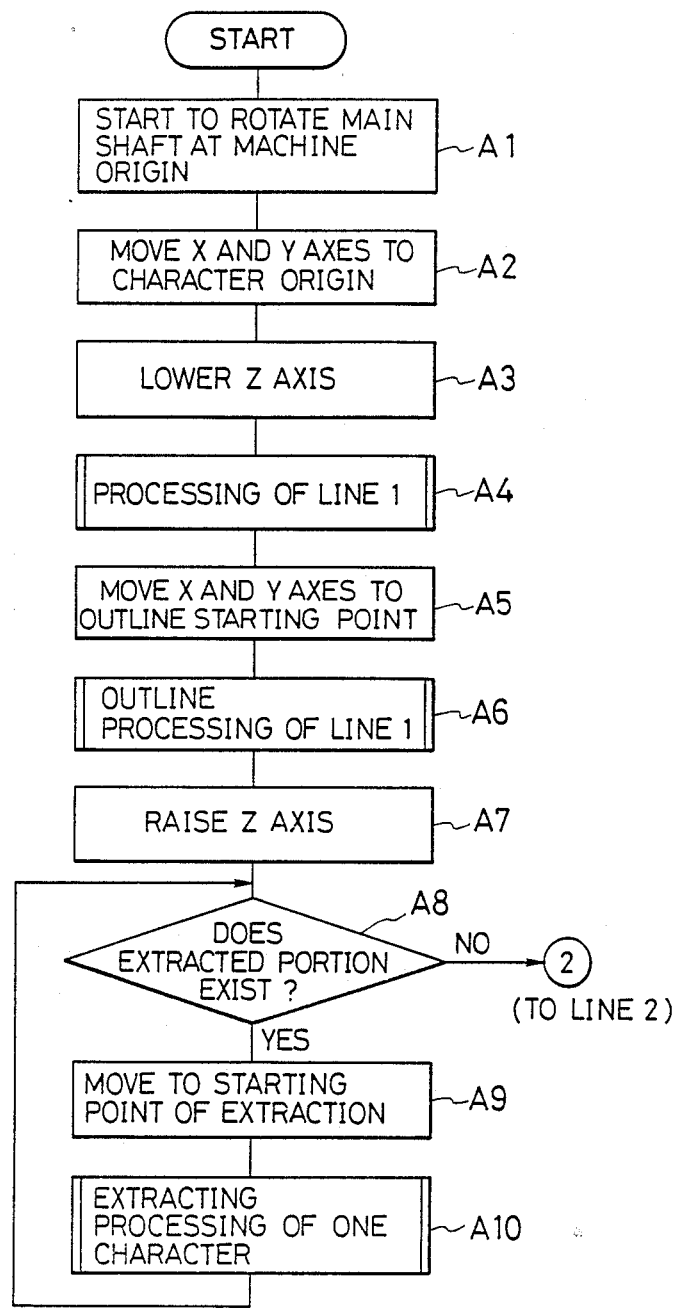
FIGS. 16 to 19 are views showing rough flow charts for embossed processes on manufacturing LINES 1 to 4, respectively, in the present invention.
Figure 26A:
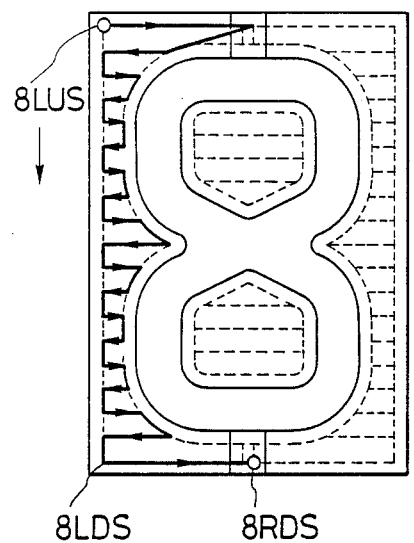
FIGS. 26A to 26D are views showing the processing sequences when pattern "8" is embossed.

Namely, in the flowchart shown in FIG. 16, when the input controller 41 is started, the spindle 31 controlled by the drive section 55 is rotated on a machine origin as in step A1. Next, the X and Y axes of the spindle 31 are moved to an origin of a character to be processed as in step A2. In step A2, as shown in FIG. 26A, when character "8" is embossed, the spindle 31 is moved such that the X and Y axes of the spindle 31 are located at starting point 8LUS at a corner of the card material 1 on the left upper outside thereof. The X axis of the spindle 31 is then lowered in step A3. The cutter of the spindle 31 thus cuts the card base material 1 in the right direction, for example, from the starting point 8LUS, and cuts the card base material 1 in the left direction after the cutter is displaced by one pitch in the downward direction. Thus, the card base material 1 is continuously cut by the cutter in the right and left directions while the cutter is displaced every one pitch in the downward direction so that the card base material 1 is cut along the outer outline of the character "8" from above to below, as in step A4. FIG. 26A shows such a cutting operating state.

When the cutter reaches the point of the lowermost processing line, the cutter returns to point 8RDS in the central portion of this line, and is moved to the right from this point, and is displaced by one pitch in the upward direction, and is then moved to the left. Thus, the cutter is continuously moved in the right and left directions while the cutter is displaced every one pitch in the upward direction so that the cutter reaches point Q at the right end of the uppermost processing line.

Figure 26B:
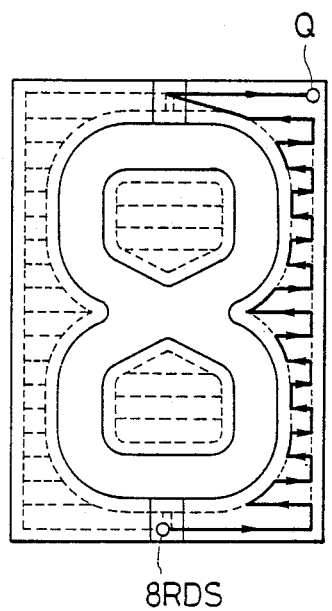

The step A4 showing the processing operation on manufacturing LINE 1 of FIG. 16 is thus completed, and all of the circumferential portion of character 8 is cut by the cutter, as shown in FIGS. 26A and 26B.

Figure 26C:
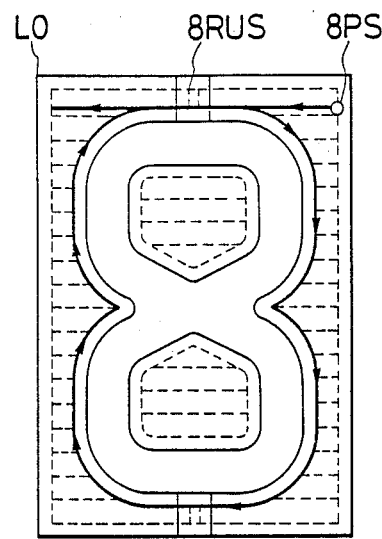

Next, step A5 of FIG. 16 is performed, and the X and Y axes of the cutter of the spindle 31 are moved to a starting point of the outline of the character. When the character "8" is cut, as shown in FIG. 26C, the cutter of the spindle 31 is moved to point 8PS located slightly below point Q, and is moved to the left. When the cutter approximately reaches a central portion of the same line as the one of point 8PS, the cutter is moved along the outside outline of character "8" in the clockwise direction, for example, while the cutter is moved in the downward direction, thereby cutting the outside outline of character "8" in step A6.

When the cutter is then moved from below to above on the left hand side and approximately reaches a central portion of line of point 8PS, the cutter is moved to the left from this portion, and is moved upwards in the Z axis direction in step A7. The cutter is thus separated from the card base material 1 and is moved to character origin LO.

Figure 26D:
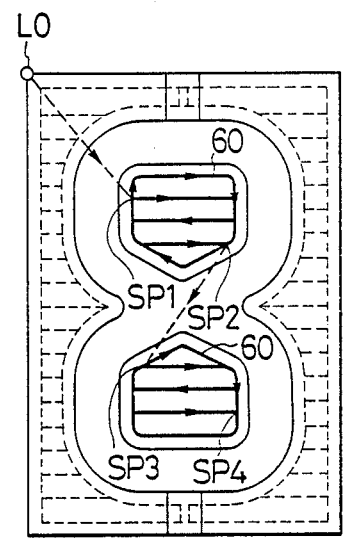

In step A8, it is judged whether the character to be processed has an extracted portion or not. When the character has an extracted portion, as shown in FIG. 16, the cutter is moved to a starting point of the extracted portion in step A9. In the case of character "8", there are two extracted portions 60, and therefore step A9 is performed. Namely, as shown in FIG. 26D, the cutter of the spindle 31 is moved to starting point SP1 of the upper extracted portion 60 from character origin LO without performing the cutting operation. Thereafter, the cutter is moved to the right, for example, from starting point SP1, and is displaced by one pitch in the downward direction. The cutter is then moved to the left, and is displaced by one pitch in the downward direction, and is further moved to the right so that the cutter reaches point SP2. Thereafter, the cutter cuts the outline of the upper extracted portion 60 in the clockwise direction, for example, thereby completing the cutting operation of the upper extracted portion 60.

Next, the cutter is moved to starting point SP3 of the lower extracted portion 60 from point SP2 of the upper extracted portion 60 without performing the cutting operation. The cutter is then moved to the right from starting point SP3, for example, and is displaced by one pitch in the downward direction, and is moved to the left. The cutter is further displaced by one pitch in the downward direction, and is moved to the right so that the cutter reaches point SP4. The cutter then cuts the outline of the lower extracted portion 60 from point SP4 in the clockwise direction, for example, thereby completing the cutting operation of the lower extracted portion 60. At this time, the cutter is located at point SP4, and the cutting processing of the extracted portions of the character is thus completed in step A10.

When step A10 of FIG. 16 is completed, step A8 is again performed to judge whether the character further has an extracted portion or not.

Figure 17:
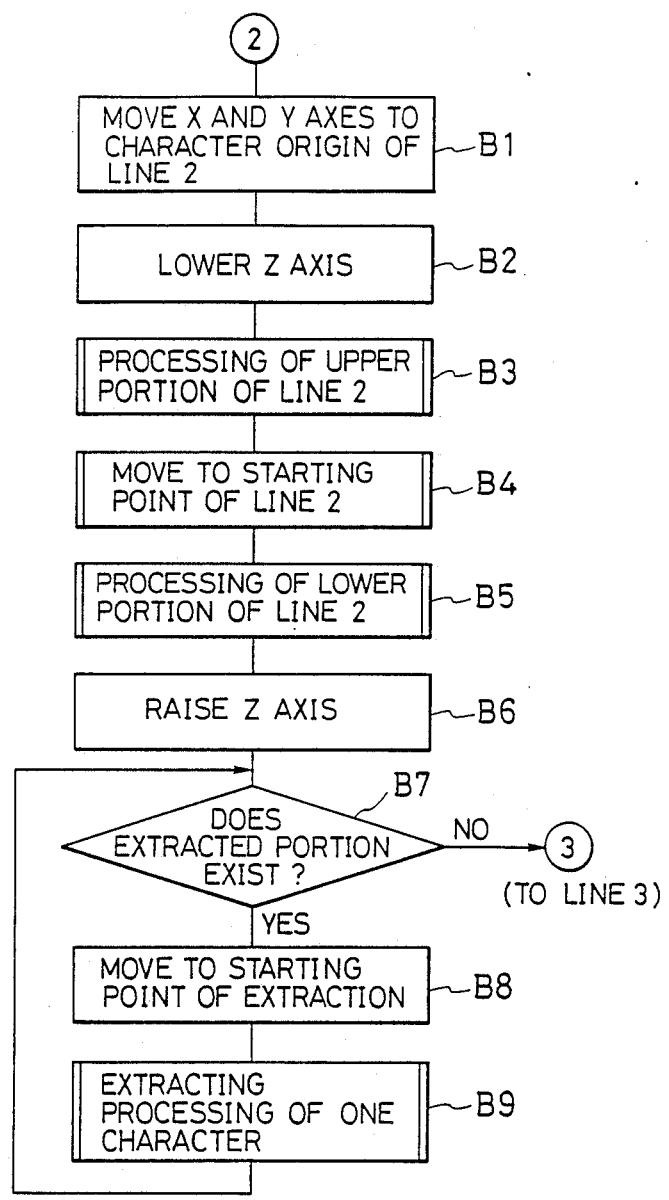

In step A8, when the character has no extracted portion to be processed, the processing of manufacturing LINE 2 of FIG. 17 is performed so that the cutter of the spindle 31 is moved to the right to process a new character adjacent to the right of the cut character such as character "8".

Figure 27A:
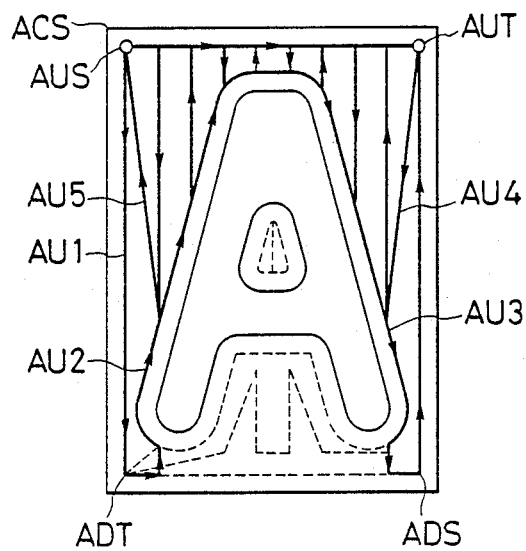
FIGS. 27A to 27C are views showing the processing sequences when pattern "A" is embossed.
Figure 27B:
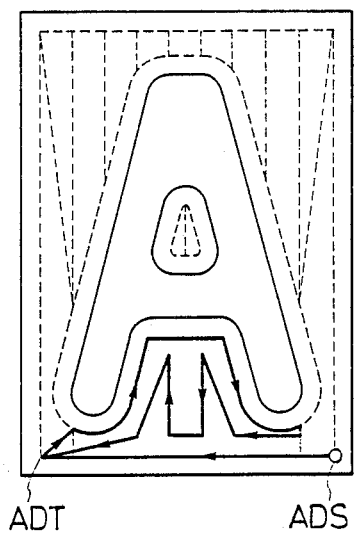
Figure 27C:
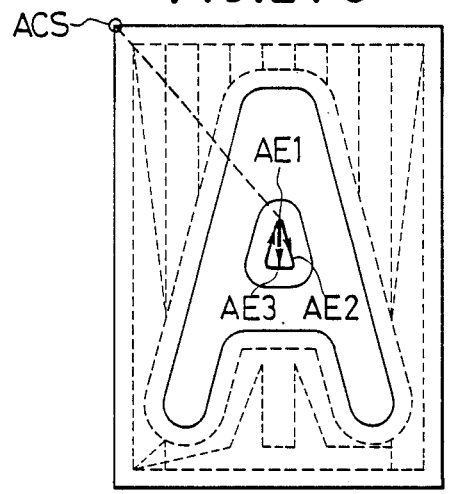

When a character "A" is adjacent to the right of character "8", for example, and is embossed, the embossing operation is performed as shown in FIGS. 27A to 27C in accordance with the flowchart of FIG. 17.

Namely, in FIG. 27A, the X and Y axes of the cutter are moved to character origin ACS at a left upper corner in step B1. The cutter is further moved to point AUS, and is lowered in the Z axis direction thereof in step B2. The cutter of the spindle 31 is moved from starting point AUS downwards along line AU1, and reaches point ADT at the lower end, and is then moved to the right. Thereafter, the cutter is moved upwards along line AU2 constituting the left outside outline of character "A", and is then lowered along line AU3 constituting the right outside outline of character "A". After the cutter reaches point ADS at the right lower end, the cutter is moved upwards and reaches point AUT at the right upper end. After that, the cutter is moved upwards and downwards along line AU4 while the cutter is displaced every one pitch in the left direction, thereby performing the cutting operation of the upper portion of character "A". After the cutter is moved from below to above along line AU5 and is displaced by one pitch from the right to the left, the cutter is moved to the right from point AUS and returns to terminal point AUT at the right upper end, thereby performing the cutting operation of the upper side portion of character "A" in step B3.

Next, as shown in FIG. 27B, the cutter is moved to points ADS at the right lower end in step B4, and cuts the lower portion of character "A" from this point in step B5. Namely, the cutter is moved to the left from point ADS, and reaches point ADT at the left lower end, and is slantingly moved upwards from this point ADT, and is then moved from the left to the right along an outline portion of the lower portion of character "A". The cutter is then moved slightly downwards, and is moved upwards and downwards while the cutter is moved to the left, and thereafter reaches point ADT at the left lower end, thereby performing the cutting operation of the lower portion of character "A" and completing step B5.

When, an extracted portion of character "A" is processed, as shown in FIG. 27C, the Z axis of the cutter is raised in step B6 and the cutter is moved to character origin ACS. Since character "A" has an extracted portion, it proceeds from step B7 to step B8, and the cutter is moved to starting point AE1 of the extracted portion without performing the cutting operation. The cutter is moved from this point AE1 along outline AE2 of the extracted portion in the clockwise direction, for example, and is lowered to point AE3 from point AE1, thereby completing the cutting operation of the extracted portion in step B9.

The embossing operation of character "A" has thus been performed as mentioned above.

Figure 18:
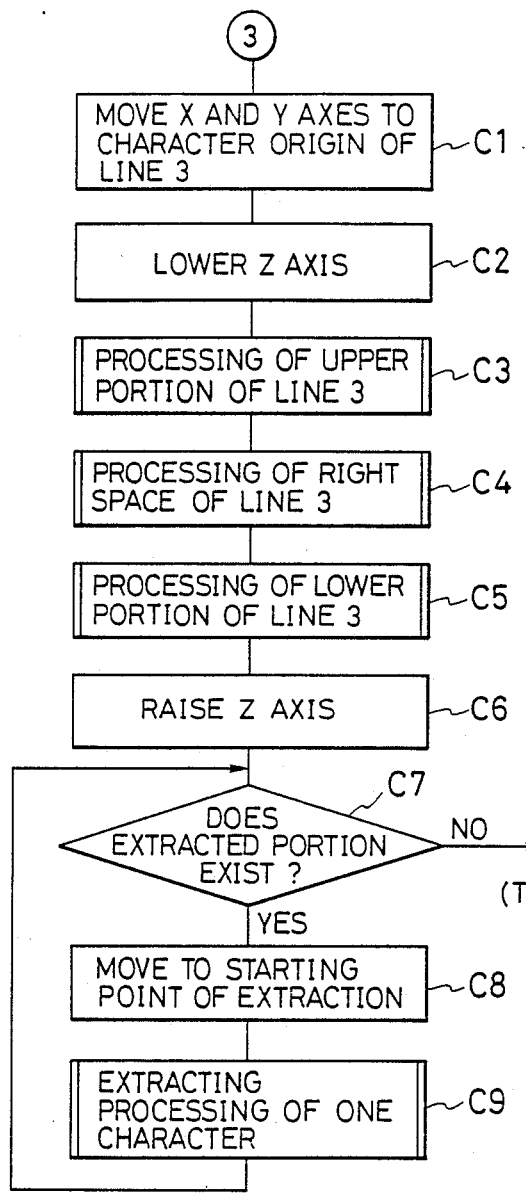

In step B7 of FIG. 17, when it is judged that there is no extracted portion, it proceeds to manufacturing LINE 3 of FIG. 18, and the cutter of the spindle 31 is moved to perform the embossing operation of the card base material as on LINES 1 and 2.

Namely, in FIG. 18, the X and Y axes of the cutter are moved to an origin of a new character adjacent to the right of the cut character "A" in step C1, and the Z axis of the cutter is lowered in step C2. Then, an upper portion of this new character is processed in step C3, and a space processing is performed with respect to a blank located in a right side portion of this character in step C4. Thereafter, a lower portion of the character is processed in step C5, and the Z axis of the cutter is raised in step C6. Then, it is judged in step C7 whether the character has an extracted portion or not. When the character has an extracted portion, it proceeds to step C8 so that the cutter is moved to a starting point for processing the extracted portion, thereby performing the cutting operation of the extracted portion in step C9. Thereafter, it is judged whether the character further has an extracted portion or not. When the character further has an extracted portion, it again proceeds to step C8, and when the character has no extracted portion, it proceeds to manufacturing LINE 4 of FIG. 19.

Figure 19:
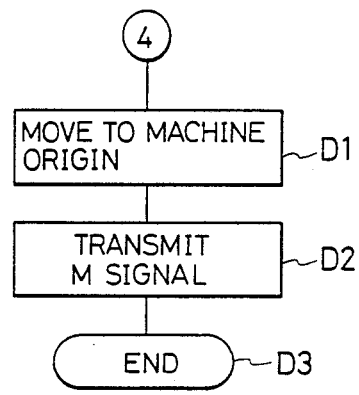

In FIG. 19, when the cutter of the spindle 31 is moved to a mechanical origin in step D1, the operation of the apparatus including the spindle 31 is stopped, thereby completing the embossing operation in step D3.

The card base material 1 has thus been cut and embossed by the input controller 41 as mentioned above.

Figure 20B:
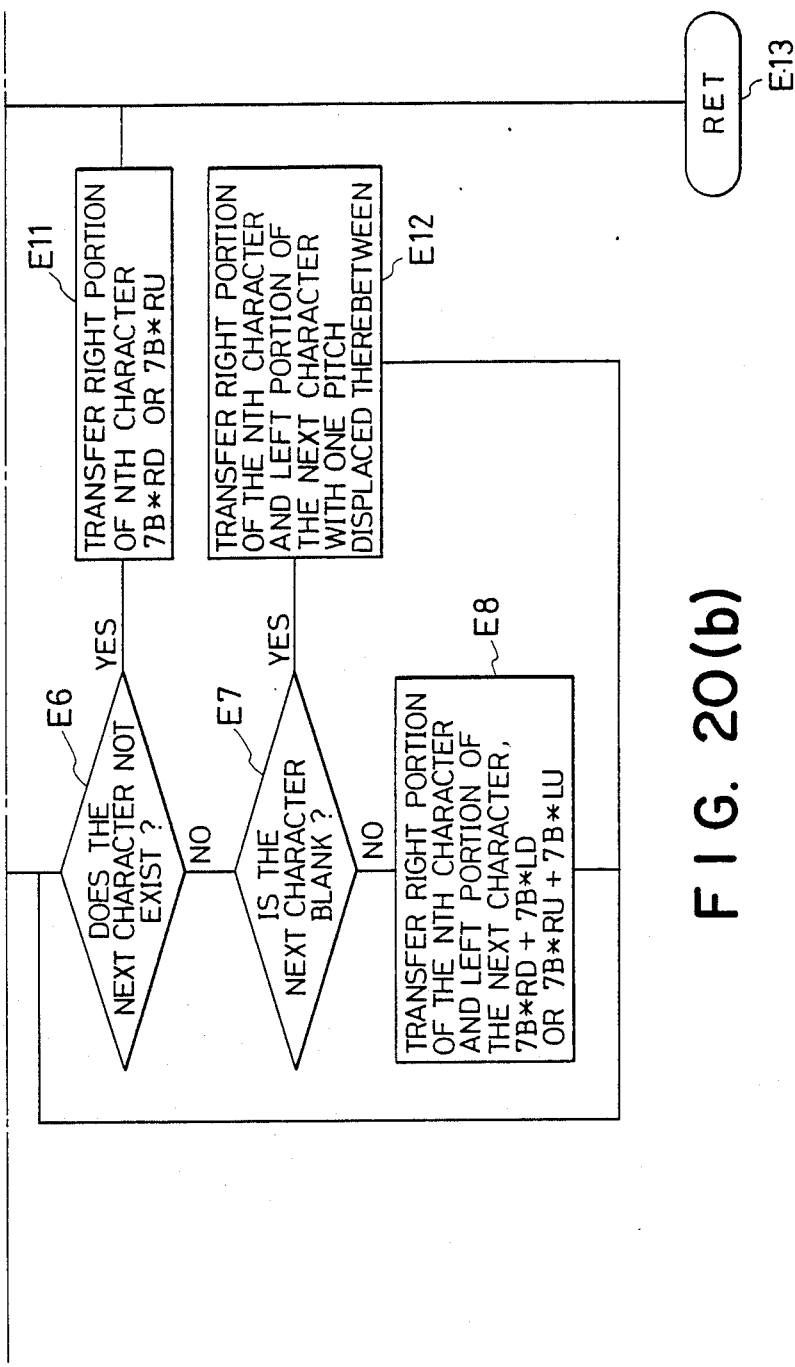

FIG. 20 is a flowchart showing the detailed processing steps of manufacturing LINE 1 of FIG. 16 and shows a pocketing processing.

Figure 28A:
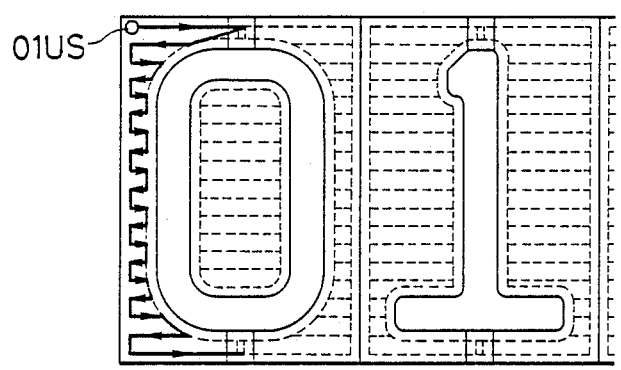
FIGS. 28A to 28E are views showing the processing sequences when a combination of patterns "0" and "1" is embossed.

As shown in FIG. 28A, when a series of patterns are constituted by characters "0" and "1", for example, on LINE 1, the patterns are embossed by the steps shown in FIG. 20.

Namely, the cutter of the spindle 31 is moved to processing starting point 01US in step E1, and is moved in the right and left directions while the cutter is displaced every one pitch in the downward direction, as shown in FIG. 28A. At this time, increment processing data with respect to a left portion of a first character "0", which are shown as 7B*LU in step E2, where L designates left, and U designates upper, are transferred to the control section 53, etc., of the control section 47 in the input controller 41.

Next, in step E3, when there is no next or second character adjacent to the right of the first character "0", data 7B*RD with respect to a right portion of the first character, where R designates right and D designates down, are transferred to the control section 47 in step E9, and thereafter it proceeds to return step E13. In step E3, when there is a second character such as character "1" as in FIG. 28A, it proceeds to step E4 where it is judged whether the second character is a blank or not. When the second character is a blank, it proceeds to step E10 where data with respect to a right portion of the first character and a left portion of the next character with one pitch displaced therebetween, 7B*RD+(one pitch)+7B*LD, are transferred to the control section 47.

In step E4, when the second character is not a blank and is "1", for example, data with respect to a right portion of the first character and a left portion of the next character, 7B*RD+7B*LD are transferred to the control section 47 in step E5.

Thereafter, it proceeds to step E6 where it is judged whether there is a third character adjacent to the right of the second character or not. When there is no third character, data with respect to a right upper or lower portion of the third character, 7B*RD or 7B*RU are transferred to the control section 47 in step E11, and thereafter it proceeds to return step E13. In step E6, when there is the third character, it proceeds to step E7 where it is judged whether the third character is a blank or not. When the third character is a blank, it proceeds to step E12 where data with respect to a right portion of the third character and a left portion of the next character with one pitch displaced therebetween are transferred to the control section 47.

In step E7, when the third character is not a blank, it proceeds to step E8 where data with respect to a right portion of the third character and a left portion of the next character, 7B*RD+7B*LD, or 7B*RU+7B*LU, are transferred to the control section 47. After steps E8 and E12, it proceeds to before step E6 where it is judged whether there is a fourth character or not. Such processes are repeated until the character has reached an Nth character in general.

Figure 28B:
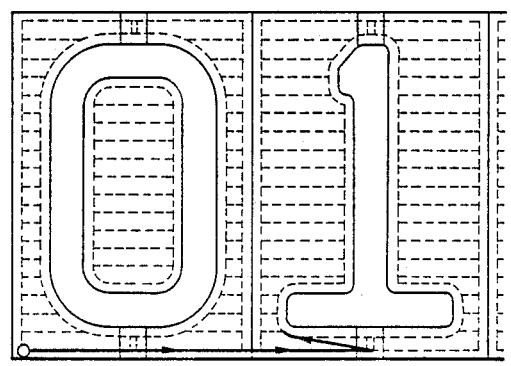
Figure 28C:
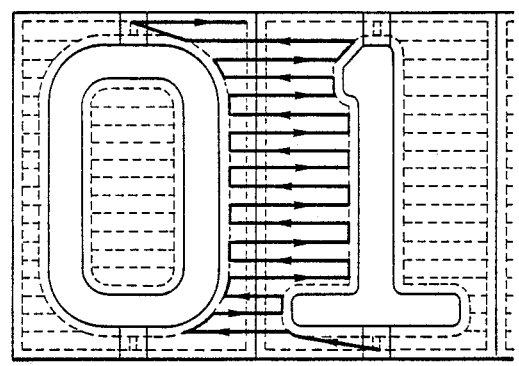
Figure 28D:
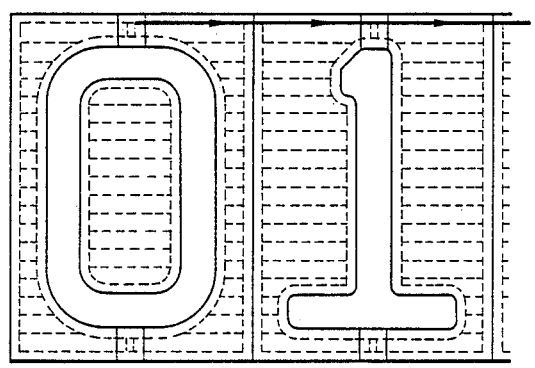
Figure 28E:
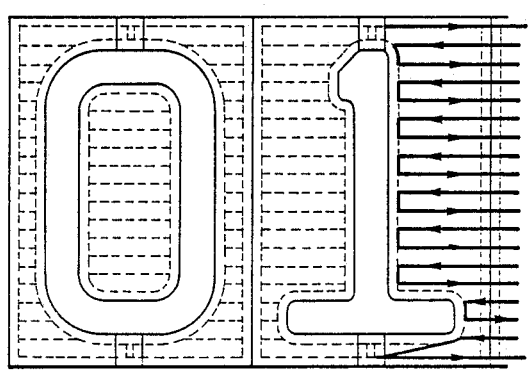

In accordance with the steps shown in FIG. 20, the cutter is moved as shown in FIGS. 28A to 28E. Namely, in FIG. 28A, data with respect to a left portion of character "0", 7B*LU, are transferred to the control section 47 in step E2, thereby performing the embossing operation of this left portion. Next, it proceeds to steps E3 to E5, and data with respect to a right portion of character "0" and a left portion of character "1", 7B*RD+7B*LD, are transferred to the control section 47 as shown in FIGS. 28B and 28C, thereby performing the embossing operation of these portions. Next, it proceeds to steps E6 to E8, and the cutting operation is performed as shown in FIGS. 28D and 28E when there is a character "2", for example, adjacent to the right of character "1".

Figure 28F:
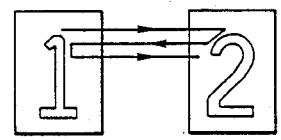
FIG. 28F is a view showing a processing step when a blank is disposed between patterns "1" and "2"

When there is a blank between characters "1" and "2" as shown in FIG. 28F, it proceeds to step E12 of FIG. 20, and data with respect to a right portion of character "1" and a left portion of the next character "2" with one pitch displaced therebetween are transferred to the control section 47. At this time, the cutter is moved by calculating and adding the distance of one pitch to the data with respect to a right upper portion of character "1" and a left upper portion of character "2".

Figure 21:
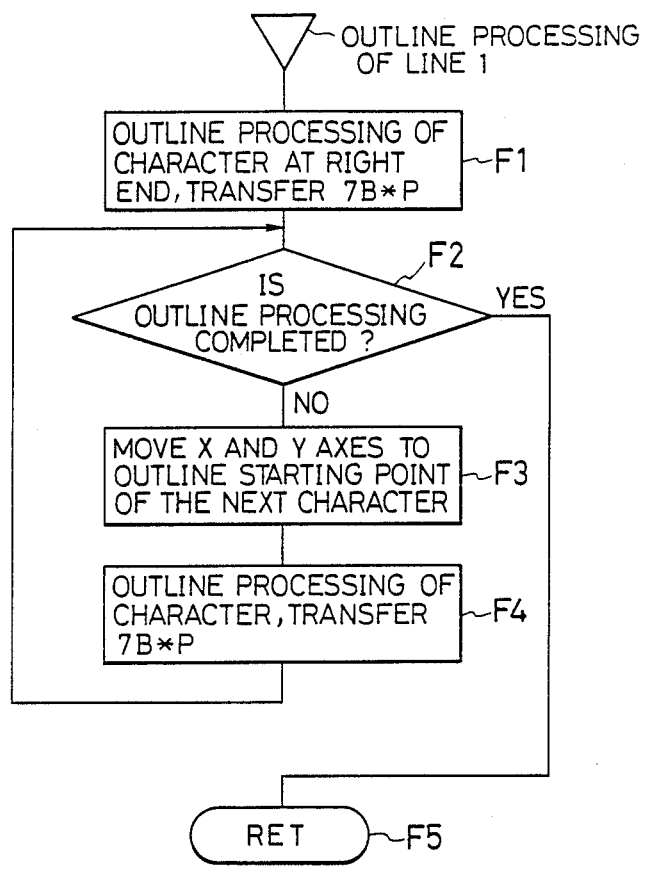
Figure 28G:
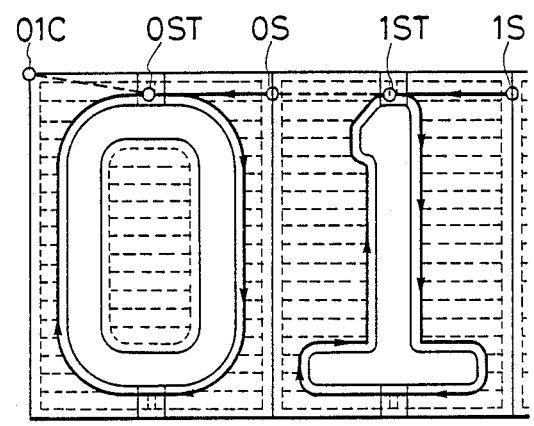
FIG. 28G is a view showing the processing sequences when the outline of the combination of patterns "0" and "1" is processed.

When the outline of a character on LINE 1 is processed as shown in FIG. 21, the cutter is moved from the right to the left as shown in FIG. 28G to perform the outline processing from the character at the right end, and data with respect to this outline processing such as 7B*P are transferred to the control section 47 in step F1. In step F2, it is judged whether the outline processing is completed or not. When the outline processing is completed, it proceeds to return step F5.

When the outline processing is not completed in step F2, it proceeds to step F3, and the X and Y axes of the cutter are moved to a starting point for the outline processing of the next character. Thus, the outline processing of the character is performed, and the data thereof 7B*P are transferred to the control section 47. Then, it proceeds to before step F2, and steps F2 to F4 are repeated.

FIG. 28G shows the outline processing performed in accordance with the steps of the outline processing of FIG. 21. In FIG. 28G, the cutter is moved from the right to the left to perform the outline processing of the character from the top thereof. The cutter is moved to starting point 1S at the right upper end of character "1", and is thereafter moved to point 1ST in a central portion of the top of character "1". The cutter is then moved along the outline of character "1" in the clockwise direction to perform the outline processing of the character, and again returns to point 1ST, and it proceeds to step F3 from step F2. The cutter is then moved to the left through starting point 0S for the outline processing of character "0" from point 1ST without performing the cutting operation, and reaches point 0ST in a central portion of the top of character "0". The cutter is then moved from this point 0ST in the clockwise direction to perform the outline processing of character "0". Thereafter, when the cutter again reaches point 0ST, the step F4 is completed, and it proceeds to before step F2. In FIG. 28G, after the completion of the outline processing of character "0", the cutter is moved from point 0ST to origin 01C at the left upper end for the cutting processing of an extracted portion without performing the cutting operation.

Figure 29:
FIG. 29 is a view showing the movement of the cutter when the cutter is moved from a terminal point for processing an extracted portion of pattern "0" to a starting point for processing an extracted portion of pattern "6"

After the outline processing of the character is completed in FIG. 21, as shown in FIG. 29, the cutter is moved from origin 01C to a starting point for the processing of the extracted portion of character "0", and performs the cutting operation of this extracted portion as mentioned before. The cutter is then moved from a terminal point for the outline processing to starting point 6S for the processing of an extracted portion of character "6", for example, without performing the cutting processing, and thereafter performs the extracting processing of character "6".

Figure 22:
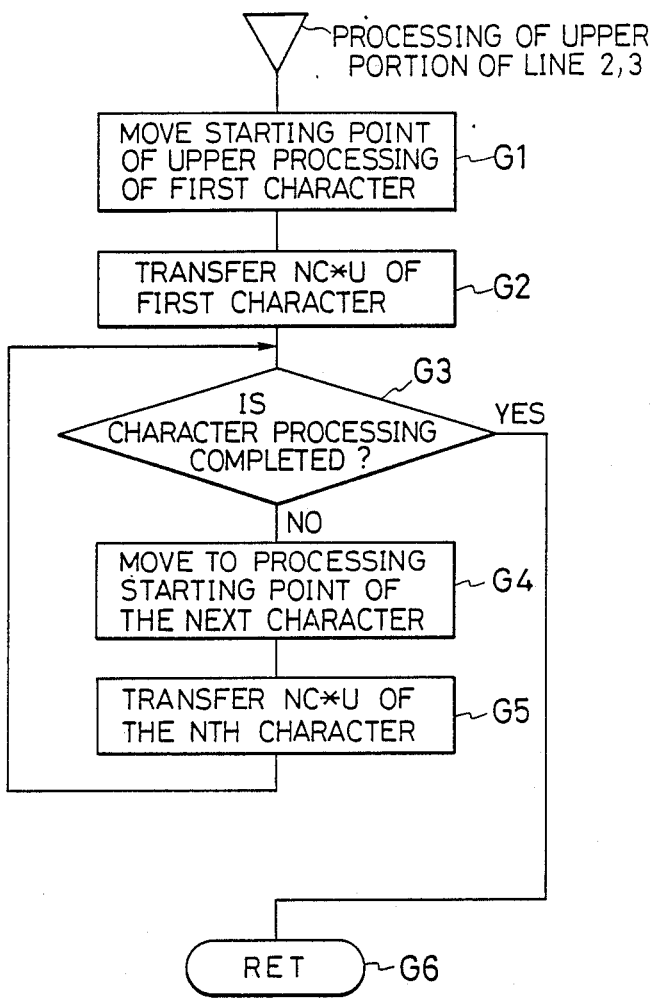
FIGS. 22 to 24 are views showing flow charts of processing of an upper portion, a right space and a lower portion, respectively, on manufacturing LINE 2 or 3.
Figure 23:
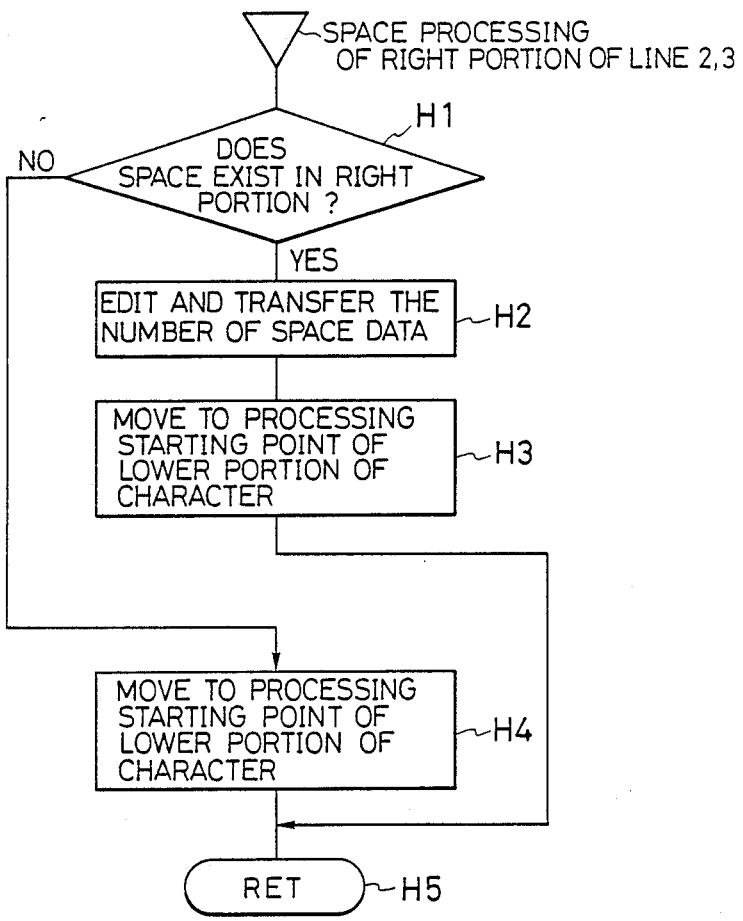
Figure 24:
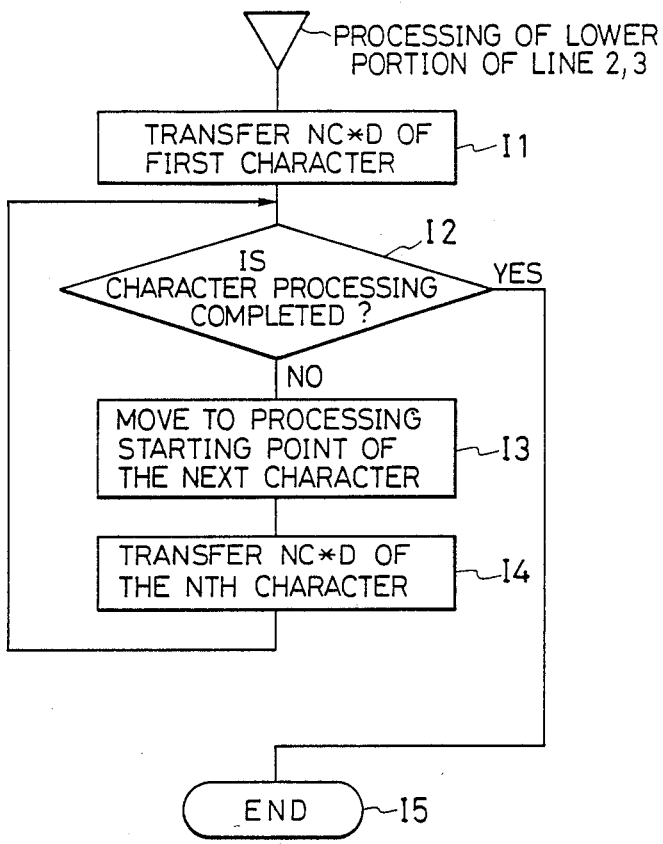

FIGS. 22, 23 and 24 respectively show steps in the processings of an upper portion, a space in a right portion, and a lower portion of a series of characters at LINES 2 and 3. The steps of FIGS. 22, 23 and 24 will next be described with reference to FIGS. 30A to 30J.

Figure 30A:
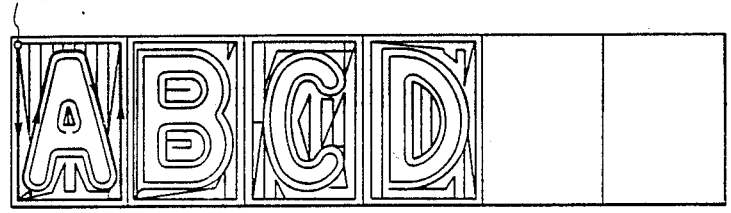
FIGS. 30A to 30J are views showing the processing sequences when a series of patterns having A, B, C and D and two blanks at the right end are embossed.
Figure 30B:
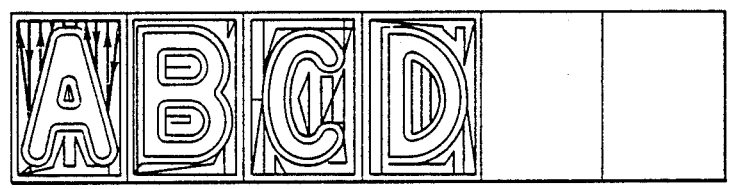
Figure 30C:
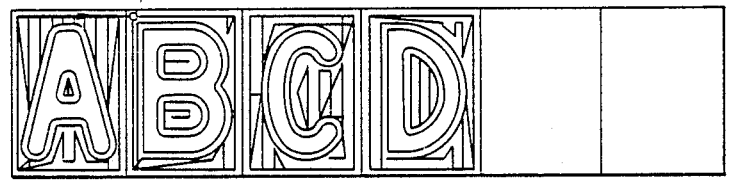

In FIG. 22, when an upper portion of a first character "A" on LINE 2, for example, is processed, the cutter is moved to processing starting point AUS in FIG. 30A in step G1. Next, increment data of the first character "A" shown by NC*U are transferred to the control section 47 in step G2, and the upper portion of character "A" is processed as shown in FIG. 30B. Then, it proceeds to step G3, and thereafter proceeds to return step G6 when the processing of the character is completed. When the processing of the character is not completed, it proceeds to step G4. In step G4, the cutter is moved to starting point BUS for processing the next character "B", for example, in FIG. 30C, and this character is processed, and the data thereof NC*U are transferred to the control section 47. Thereafter, it returns to before step G3, and steps G3 to G5 are repeated. After the processing of the upper portion of the series of the characters is completed, the processing of a space in a right portion is started on LINE 2 of FIG. 23.

Figure 30D:
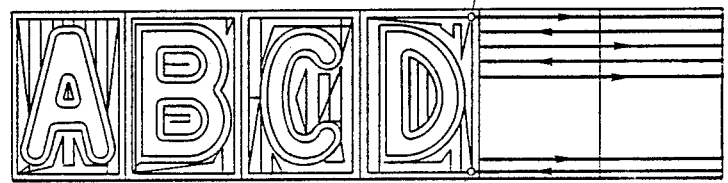
Figure 30E:
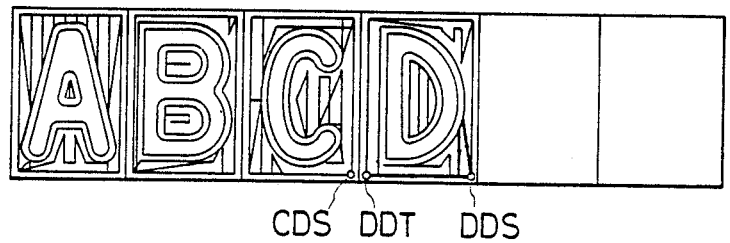

In FIG 23, it is judged in step H1 whether there is a space portion in a right portion of character "D", for example, as shown in FIG. 30D. When there is no space portion, it proceeds to step H4, and the cutter is moved to starting point DDS for processing a lower portion of the character, thereafter proceeding to step H5. When there is a space portion, it proceeds to step H2 where data with respect to the number of blanks or spaces from terminal point DUT of the upper portion of character "D" are edited and transferred to the control section 47. In this case, as shown in FIG. 30D, the data with respect to the number of blanks are edited by calculating the number of blanks multiplied by the number of pitches from point DUT to point DDS. In FIG. 30D there are two blanks on the right hand side character "D", and each of the two blanks is constituted by a number of pitches. Since a first pitch is started from point DUT to the right, it is constituted such that a pitch of an odd number passes through point DDS from the right to the left. The processing may be performed at lines having odd numbers.

Next, it proceeds to step H3 of FIG 23, and the cutter is moved to starting point DDS for processing the lower portions of the characters, thereafter proceeding to return step H5.

The processing of the space in the right portion of the series of characters has thus been completed.

Next, as shown in FIG. 24, the processing of the lower portions of the series of characters is started. Namely, in step I1, a lower portion of the first character "D" from the right is processed from starting point DDS towards terminal point DDT in FIG. 30E, and the data thereof NC*D are transferred to the control section 47. Thereafter, it is judged in step I2 whether the processing of the characters is completed or not. When the processing of the characters is completed, it proceeds to return step I5. When the processing of the characters is not completed, the cutter is moved to starting point CDS for processing the next character "C" in FIG. 30E. The lower portion of character "C" is then processed, and the data thereof NC*D are transferred to the control section 47 in step I4. Thereafter, it proceeds to before step I2, and steps I2 to I4 are repeated.

Figure 30F:
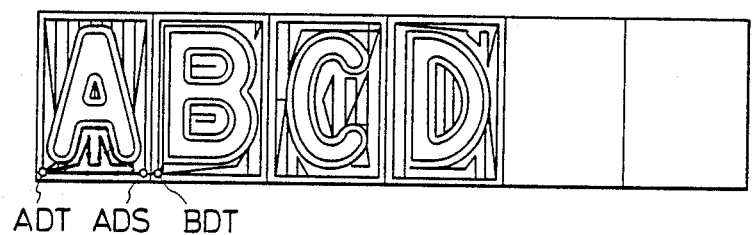
Figure 30G:
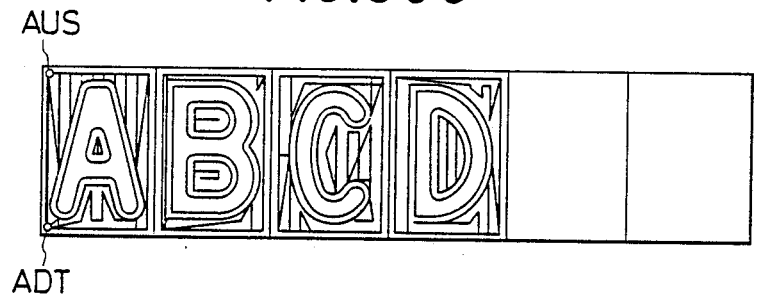

Thus, as shown in FIGS. 30F to 30G, the cutter is moved to character starting point AUS at the left upper end through terminal point BDT in the lower portion of character "B", starting point ADS of the upper portion of character "A", and terminal point ADT of the lower portion of character "A".

Figure 30H:
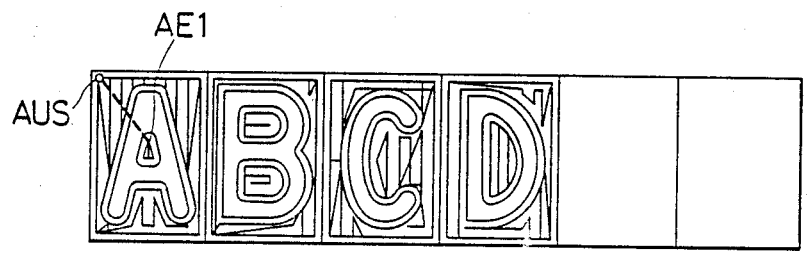
Figure 30I:
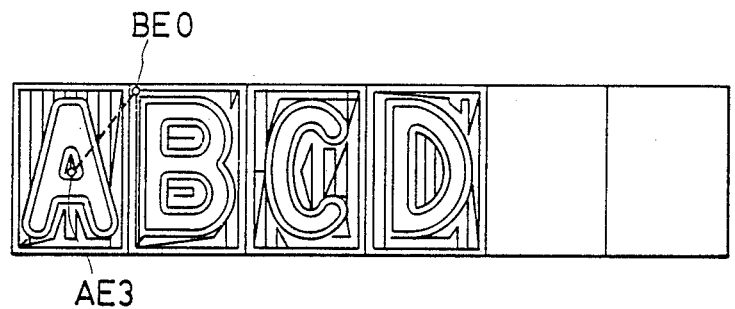

When the processing of extracted portions of the characters is performed, as shown in FIG. 30H, the cutter is moved from starting point AUS at the left upper end of character "A" to starting point AE1 for processing an extracted portion of character "A". Then, as shown in FIG. 30I, the processing of the extracted portion of character "A" is completed by moving the cutter from starting point AE1 of the extracting processing to terminal point AE3 thereof as described with reference to FIG. 27C, thereafter moving the cutter to origin BE0 for performing the extracting processing of character "B".

Figure 25:
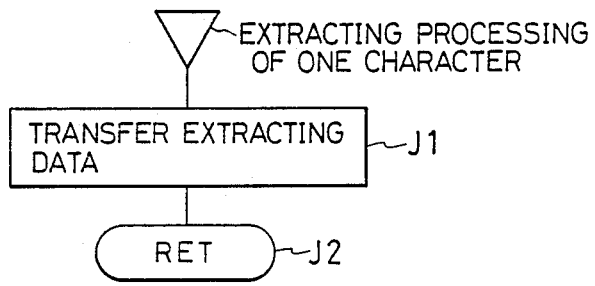
FIG. 25 is a view showing a flow chart of an extracting processing of one character.
Figure 30J:
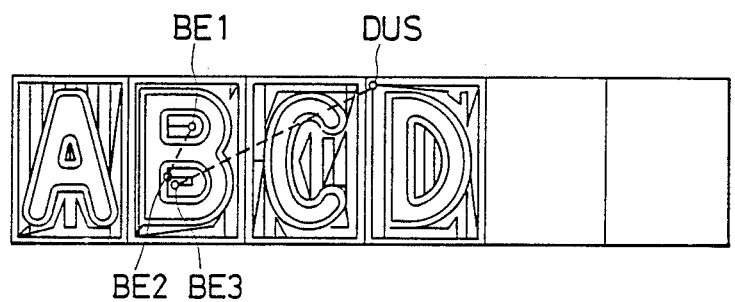

When the processing of the extracted portion of character "B" is performed, as shown in FIG. 30J, the cutter is moved from a starting point for processing an upper extracted portion of character "B", terminal point BE1 thereof, starting point BE2 for processing a lower extracted portion of character "B", to terminal point BE3 thereof. Thereafter, the cutter is moved to starting point DUS for processing character "D" without performing the cutting operation. At this time, as shown in FIG. 25, the data with respect to the extracting processing are transferred to the control section 47 in step J1, and it returns to return step J2.

The embossed processing of the series of characters has thus completed by the steps mentioned above.

What is claimed is:

1. A method of manufacturing an embossed pattern on a card, comprising the steps of:
   forming a medium on the card, the medium having a base portion adhered to the card and covering an area of the card larger than the area of the embossed pattern; and
   cutting the medium into the embossed pattern such that the base portion of the medium remains uncut.

2. The method of claim 1, wherein the medium comprises a transparent material.

3. The method of claim 1, wherein the embossed pattern comprises linearly arranged symbols.

4. A method of manufacturing an embossed pattern on a card, comprising the steps of:
   forming a medium on the card, the medium covering an area of the card larger than the area of the embossed pattern;
   cutting a part of the medium continuously into a part of an outer edge of the embossed pattern;
   cutting another part of the medium continuously into a remaining part of the outer edge of the embossed pattern; and
   cutting a remaining part of the medium into an inner edge of the embossed pattern.

5. The method of claim 4, wherein the medium comprises a photosensitive resin, and wherein the forming step comprises the steps of:
   adhering the photosensitive resin of a predetermined thickness onto an area of the card larger than that to be covered by the medium;
   laying a negative film comprising a transparent portion of an area identical to that to be covered by the medium and a remaining opaque portion, over the photosensitive resin;
   irradiating the card with ultraviolet radiations to the photosensitive resin;
   irradiating the card with ultraviolet radiations to photosensitize a part of the photosensitive resin covered by the transparent portion of the negative film; and
   removing the unphotosensitized part of the photosensitive resin.

6. The method of claim 4, wherein the forming step comprises a mold-printing of the medium.

7. The method of claim 4, further comprising the step of attaching an embossed medium made of the same material as the medium, which is to be a part of the embossed pattern without being cut, on the card.

8. The method of claim 4, wherein the embossed pattern comprises linearly arranged symbols.

9. A method of manufacturing an embossed pattern on a card, the embossed pattern comprising linearly arranged symbols, the method comprising the steps of:
   forming a medium on the card, the medium covering an area of the card larger than the area of the embossing pattern;
   cutting a part of the medium into an outer edge of the embossed pattern by cutting at least a portion of the prescribed outer edge of each symbol simultaneously with at least a portion of the outer edge of an adjacent symbol; and
   cutting the remaining part of the medium into an inner edge of the embossed pattern.

10. The method of claim 9 wherein the outer edge cutting step comprises the steps of:
    calculating the trajectories necessary to cut from the outer edge of one symbol to a common boundary between the symbol and the adjacent symbol;
    calculating the trajectories necessary to cut from the outer edge of the adjacent symbol to the common boundary;
    combining the trajectories; and
    cutting along the combined trajectories to simultaneously cut the edge portions of both the symbol and the adjacent symbol.

* * * * *